United States Patent [19]

Cuomo et al.

[11] 4,250,009
[45] Feb. 10, 1981

[54] ENERGETIC PARTICLE BEAM DEPOSITION SYSTEM

[75] Inventors: Jerome J. Cuomo, Lincolndale; Richard J. Gambino, Yorktown Heights; James M. Harper, Yorktown Heights; John D. Kupstis, Yorktown Heights, all of N.Y.

[73] Assignee: International Business Machines Corporation, Armonk, N.Y.

[21] Appl. No.: 40,339

[22] Filed: May 18, 1979

[51] Int. Cl.³ ............................................. C23C 15/00
[52] U.S. Cl. .......................... 204/192 N; 204/192 EC; 204/298
[58] Field of Search ............. 204/192 N, 192 EC, 298

[56] References Cited

U.S. PATENT DOCUMENTS

| | | | |
|---|---|---|---|
| 4,108,751 | 8/1978 | King | 204/192 N |
| 4,132,614 | 1/1979 | Cuomo et al. | 204/192 EC |

*Primary Examiner*—G. L. Kaplan
*Assistant Examiner*—William Leader
*Attorney, Agent, or Firm*—Graham S. Jones, II

[57] ABSTRACT

An energetic particle beam is accelerated towards a sputtering target. The target is located at an angle to the path of the beam (although it need not be). The target material which is dislodged by the ion beam can be directed towards a substrate. The material is composed of atoms forming both positive and negative ions. The voltage difference between the target and the substrate can be adjusted to be positive or negative so that either positive ions or negative ions can be accelerated to the substrate by means of adjusting the target-substrate voltage difference. In addition, means can be provided for collecting electrons included with the ions moving towards and away from the target. Such means can comprise a grid located adjacent to the target. It is also possible that electrons can be collected by means of an electric field confining structure which permits the ions to pass through while the electrons are deflected. Techniques used elsewhere to separate electrons from ions have included bending beams to fit through apertures and use of magnetic grids to deflect electrons differentially. In both cases, the degree of deflection of ions is far different because the mass of an ion is large relative to the mass of an electron which makes separation easy. The advantage here is that the sputter deposition makes it possible to deposit positive and negative ions alternately or in a desired graded mixture at an interface under gradually changing voltage control.

13 Claims, 12 Drawing Figures

FIG. 11

$$x_m = \frac{\Phi + EA}{2}$$

ELECTRONEGATIVITY (eV)

| H 7.18 | | | | | | | | | | | | | | | | | He — |
|---|---|---|---|---|---|---|---|---|---|---|---|---|---|---|---|---|---|
| Li 3.01 | Be 4.66 | | | | | | | | | | | B 4.29 | C 6.27 | N 7.27 | O 7.54 | F 10.41 | Ne — |
| Na 2.85 | Mg 3.82 | | | | | | | | | | | Al 3.23 | Si 4.77 | P 5.62 | S 6.22 | Cl 8.30 | Ar — |
| K 2.42 | Ca 3.06 | Sc 3.27 | Ti 3.51 | V 3.62 | Cr 3.72 | Mn 3.72 | Fe 4.06 | Co 4.28 | Ni 4.34 | Cu 4.48 | Zn 4.70 | Ga 3.15 | Ge 4.55 | As 5.31 | Se 5.89 | Br 7.59 | Kr — |
| Rb 2.34 | Sr 2.85 | Y 3.19 | Zr 3.67 | Nb 3.94 | Mo 4.05 | Tc 3.99 | Ru 4.24 | Rh 4.33 | Pd 4.47 | Ag 4.44 | Cd 4.50 | In 3.05 | Sn 4.30 | Sb 4.85 | Te 5.49 | I 6.76 | Xe — |
| Cs 2.18 | Ba 2.61 | La 3.04 | Hf 3.50 | Ta 4.25 | W 4.29 | Re 4.02 | Os 4.90 | Ir 5.35 | Pt 5.57 | Au 5.77 | Hg 5.22 | Tl 3.21 | Pb 4.26 | Bi 4.20 | Po 5.16 | At 6.15 | Rn — |
| Fr — | Ra — | Ac — | | | | | | | | | | | | | | | |

| Ce 2.99 | Pr 2.96 | Nd 3.00 | Pm 3.03 | Sm 3.07 | Eu 3.09 | Gd 3.32 | Tb 3.18 | Dy 3.22 | Ho 3.26 | Er 3.30 | Tm 3.34 | Yb 3.38 | Lu 2.97 |
|---|---|---|---|---|---|---|---|---|---|---|---|---|---|
| Th — | Pa | U | Np | Pu | Am | Cm | Bk | Cf | Es | Fm | Md | No | Lw |

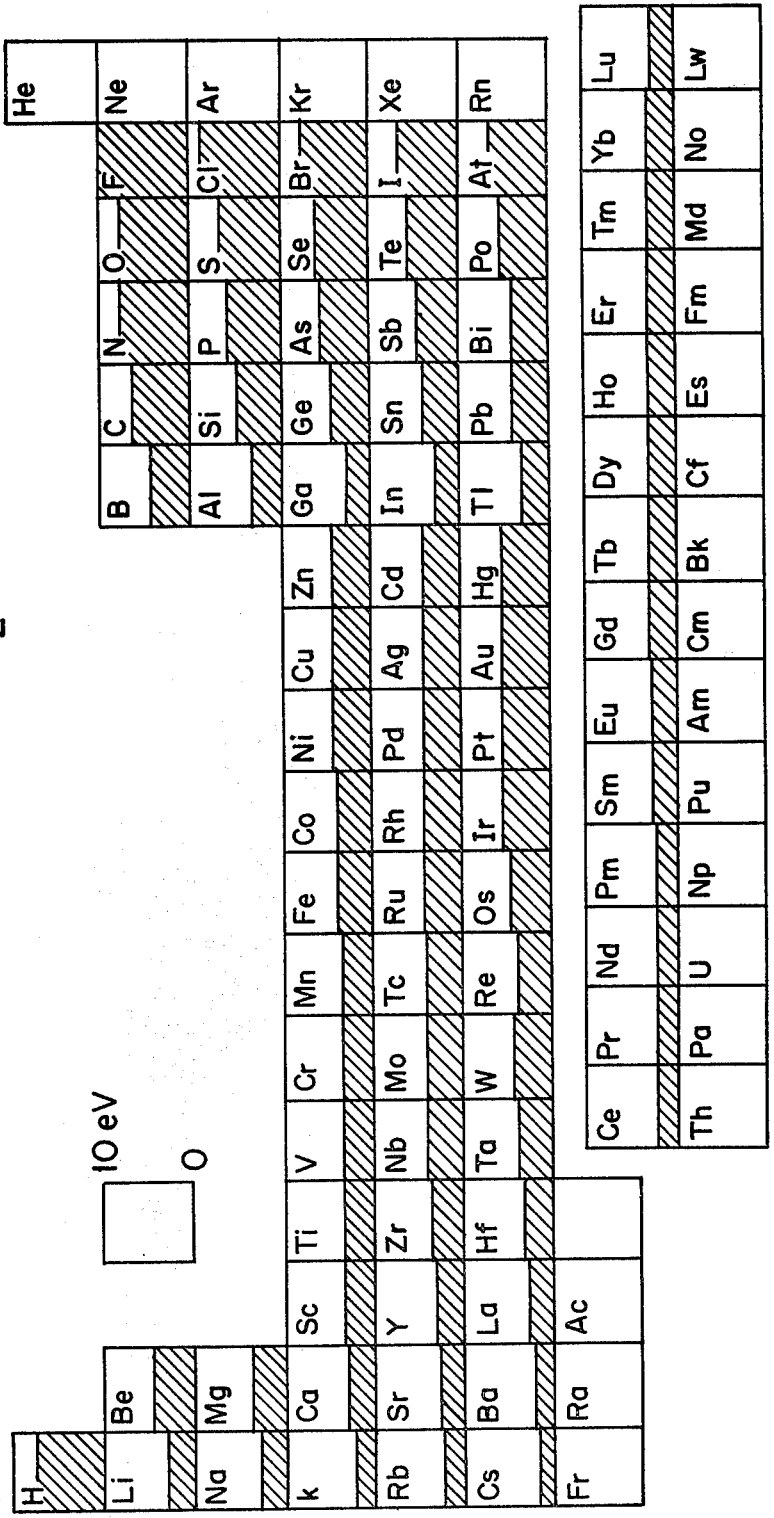
FIG. 12 ELECTRONEGATIVITY $x = \frac{1}{2}(I + EA)$

ENERGETIC PARTICLE BEAM DEPOSITION SYSTEM

DESCRIPTION

Technical Field

This invention relates to sputter deposition and etching processes and apparatus. An object of this invention is to provide a process of sputtering to deposit a plurality of metals upon a substrate with a variable composition provided in accordance with externally applied control inputs. Another object of this invention is to provide sputtering and sputter-etching of a substrate with a single system without requiring any change in the sputtering system during successive operations of sputtering and etching. This can also be associated with the process of providing variable composition of alloys either on a stepwise basis or with continuity of variations of composition as a matter of choice.

BACKGROUND ART

U.S. Pat. No. 4,132,614 of Cuomo et al, "Etching by Sputtering from an Intermetallic Target to Form Negative Metallic Ions which Produce Etching of a Juxtaposed Surface" shows how to sputter negative ions of an intermetallic compound such as SmAu. U.S. Pat. No. 3,361,659 shows a sputtering chamber with a grid located between the target 18 and the substrate 24. The purposes for which the grid is used include (1) limiting deposition to negative ions only from the target; (2) providing a small electric field accelerating ionized gas atoms towards the substrate with a positive grid potential preventing incorporation of negative (OH) ions from contaminating the deposited film; (3) the grid can be within or outside the cathode dark space (i,e, near the target). U.S. Pat. No. 3,369,990 shows sputtering with oxygen to yield an oxide. U.S. Pat. No. 3,925,187 shows a system with a set of two simple one-metal targets which are commutable and no grid so that a sandwich of plural materials can be deposited without opening up the system, but the targets must be rotated and can be used only on a one-at-a-time basis; so graded, as distinguished from sharp variations in composition, cannot be achieved by cosputtering.

The formation of negative ions in the sputtering of highly ionic compounds such as $TbF_3$ was reported by Hanak et al, "Effect of Secondary Electrons and Negative Ions on Sputtering of FIlms," J. Vac. Sci. Technol., Vol. 13, No. 1, January/February 1976, pp. 406-409. It describes cosputtering from a target of $TbF_3$ and a target of ZnS, etching of the substrate directly opposite the $TbF_3$ target. "It was postulated that etching of the substrate over the $TbF_3$ was caused by the sputtering of the substrate by $F^-$ ions first released by the target and then accelerated and focused onto the substrate at full target-substrate voltage . . . ." It also speculates that other negative ions "such as those observed by Honig, [Refs.] 3,4 would be expected to produce a similar effect", referring to oxides, and ZnS, involving sulfide and oxide ion bombardment. Both examples selected were those of nonmetals. Halide ions are also mentioned. Honig is cited by Hanak as referring to $Cl^-$, $F^-$, $Br^-$, $O^-$, $OH^-$, $O_2^-$, $S^-$, $C_1^-$ to $C_{10}^-$, $SH^-$, $Ag_2^-$ and $Ag_2O^-$ as sources of negative ions.

BRIEF DESCRIPTION OF THE DRAWINGS

In the accompanying drawings forming a material part of this disclosure,

FIG. 11 is a chart of the numerical values of electronegativity of some elements on the periodic table of elements.

FIG. 12 another chart with a bar graph form of representation of values of electronegativity of elements on the periodic table of elements.

DISCLOSURE OF INVENTION

Figure 1:
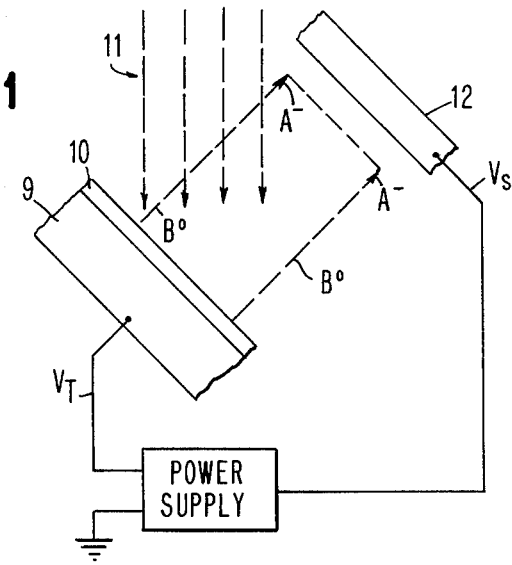
FIG. 1 shows an energetic particle beam directed upon a sputtering target electrode for sputtering upon a substrate juxtaposed thereto at an angle other than the angle of reflection of the impinging particle beam. The target and the substrate are electrically biased by a power supply.

FIG. 1 shows an energetic particle beam sputtering arrangement with a target electrode 10 on the holder 9. Target 10 is juxtaposed with substrate 12. Target 10 can be composed of a pair of metals in an intermetallic compound of an A and a B metal with a B metal such as Au, Pt, Ir, Hg, Po, Os, Sb, or Zn and an A metal such as Li, Na, K. Rb, Cs, Sr, In, Ba, La, Ce, Pr, Nd, Pm, Sm, Eu, Tb and Dy. Other B elements that can be used include nonmetals with high electronegativity such as C, S, N, O, F, Cl, Br and I (as suggested by Hanak et al, supra), as well as At, Se, and Te which all have high electronegativity values. Nitrogen is included because it has a high electronegativity value. However its negative ion is known to have a very short lifetime. (See FIGS. 11 and 12). Such intermetallic and other compounds are unique in that they generate negative ions of the B metal when employed as the target of a conventional R.F. diode sputtering system. Such a target can deposit SmAu on the substrate, for example, in a R.F. diode sputtering system at low negative target $V_t$ potentials and etch the substrate for higher potentials as described in U.S. Pat. No. 4,132,614 of Cuomo et al. The appropriate metallic materials are discussed in considerable detail in that patent. Target 10 and substrate 12 are held at voltages $V_t$ and $V_s$, respectively by a power supply.

It is also possible, as shown in FIG. 1, to sputter from a target 10 (e.g., SmAu) by means of directing an energetic particle beam 11 upon the target 10 (comprising, for example, a multiple aperture source broad beam ion source composed of energetic particles such as accelerated Ar atoms, neutrons, ions and other particles including combinations of atoms and other subatomic particles in addition to neutrons alone and combined subatomic particles, Ar+ ions or the like). When the beam 11 hits the target 10, negative and positive ions such as Au⁻ and Sm+ in addition to neutral Au and Sm atoms are sputtered from the target.

Neutral beams 11 are preferred because they do not generate high electrical currents at the target. When using an ion beam containing electrons, means must be provided to avoid drawing high electrical currents from the neutralizer (see wire 15 in FIG. 4) to the target when the target is biased. One such means is a wire mesh 13 in FIG. 4.

One can adjust bias potential $V_t$ of the target 10 negatively with respect to a substrate 12, tending to accelerate B element negative (e.g., Au⁻) ions towards the substrate and tending to return A element positive metal (e.g., Sm+) ions towards the target with both actions to increase the ratio of metal B (Au) in the AB alloy or compound on the substrate 12. Further, one can accelerate the B⁻ metal ions so much that they etch the substrate 12. Alternatively, the target 10 can be raised to a positive potential as in FIG. 3, thereby preferentially depositing A+ metal ions on substrate 12 and returning the B⁻ ions to the target 10 to produce an AB alloy or compound richer in metal A on substrate 12. Further, if the potential is high enough, one can etch with A metal ions. An additional alternative is to employ no electrical voltage bias on the target.

Figure 2:
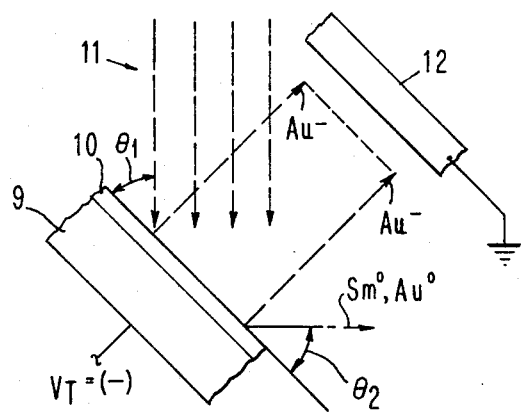
FIG. 2 shows the arrangement of FIG. 1 when the target is biased to a negative potential, the substrate is grounded, the beam is a source of particles such as argon ions and the alloy of the target is an intermetallic compound such as SmAu.
Figure 3:
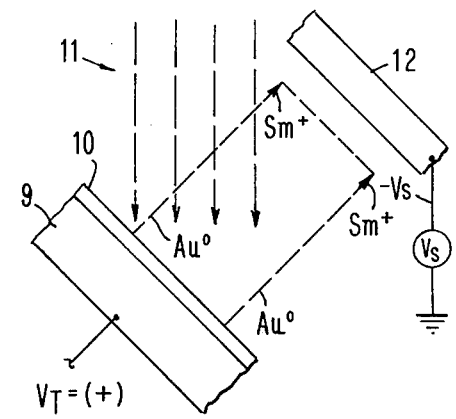
FIG. 3 is a similar arrangement to FIG. 2 where the target potential is positive, the substrate potential is a variable value which is preferably negative with respect to the target to attract positive ions such as $Sm^+$.

A secondary feature is to deposit mainly only the ions upon the substrate by minimizing the number of neutral atoms which can reach the substrate by varying the incident angle of the ion beam and the like. If, as in FIG. 2, the energetic particle beam 11 impinges on the target 10 with an angle of incidence, $\theta_1$, the sputtered neutral atoms will leave the target surface preferentially along a path that makes an angle $\theta_2$ from the target surfaces, where $\theta_1$ and $\theta_2$ are approximately equal. The flux of neutral atoms therefore, can be directed away from substrate 12 by making the angle of incidence $\theta_1$ small. The negative ions on the other hand are accelerated in the electric field gradient produced by bias potential $V_t$. The electric field gradient is normal to the target surface. Thus the (Au⁻) ions are preferentially accelerated toward the substrate 12 as shown in FIG. 2. The target and substrate may be placed in substantially parallel alignment while the target and beam are maintained at a predetermined angle whereby reflected neutral particles bounce away from the subtrate. FIG. 3 is shown assuming layer 10 is composed of a SmAu intermetallic compound with the target 10 negative with respect to the substrate but with the target positive, so Sm+ ions will be predominantly accelerated towards the substrate. We have found systems in which simply changing the polarity of charge can produce one of the constituents in an over cosine distribution. The proper choice of voltage variation can produce gradients in composition which will allow the production of graded structures.

BEST MODE FOR CARRYING OUT THE INVENTION

Figure 4:
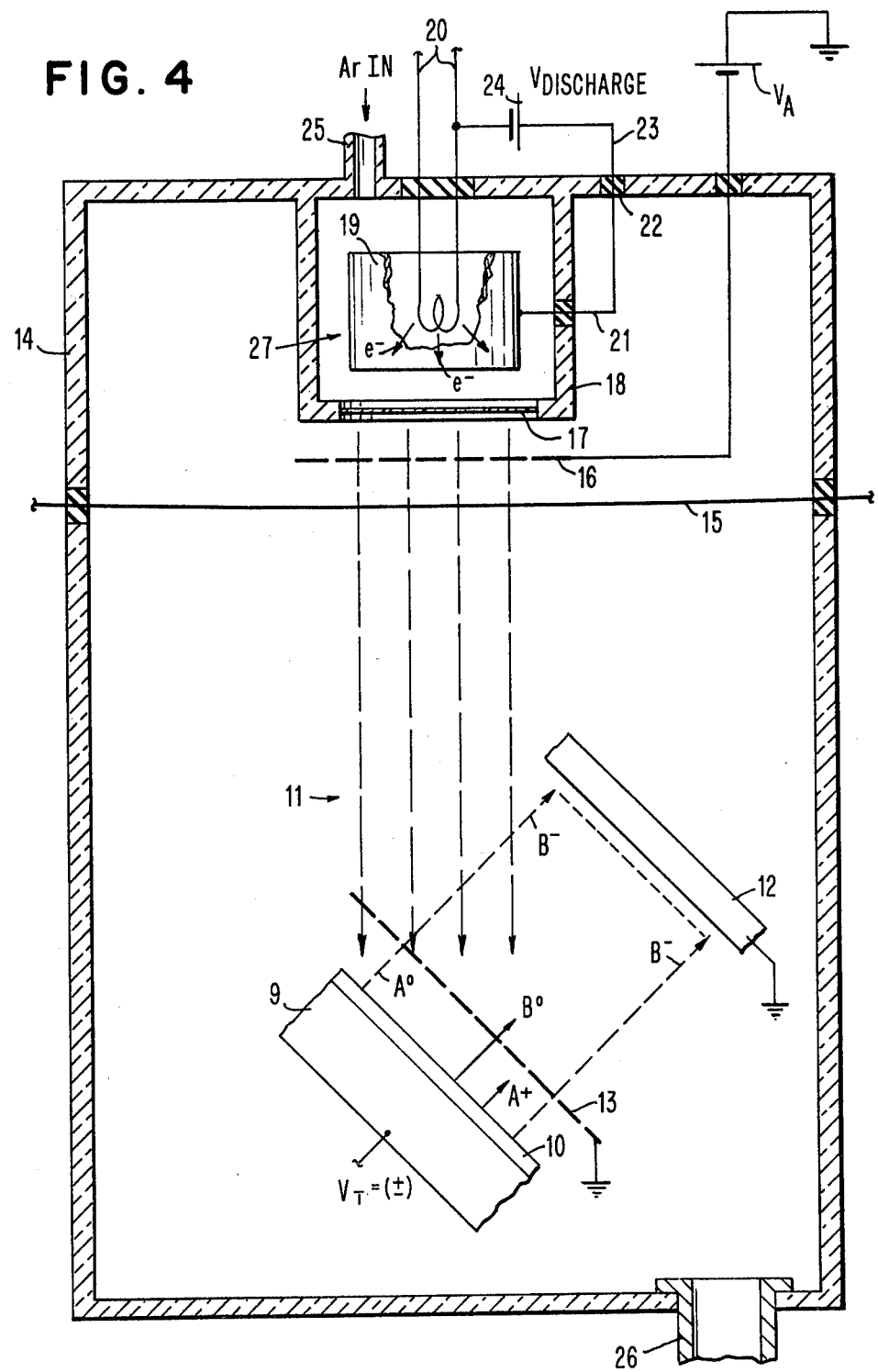
FIG. 4 shows an ion beam source for providing a particle beam as in FIG. 1 with a grid provided between the target and the substrate for inhibiting the electrons in the beam from reaching the target and the potential on the target is varied positively and negatively to provide deposition and etching of the substrate with positive and negative ions.

In FIG. 4 an evacuable sputter deposition chamber 14 is pumped down using normal vacuum procedures to a pressure in the range $10^{-7}$ Torr, through portal 26, which is connected to conventional vacuum pumping equipment. The chamber is then filled with a gas (such as Ar) in the range of $1 \times 10^{-4}$ to about $10 \times 10^{-4}$ Torr (where 1 Pascal=7.5 millitorr). The target 10 and the substrate 12 are shown generally in the configuration shown in FIG. 2 with the addition of a wire mesh grid 13 above target 10 which serves to separate the electrons in the beam 11 from the ions to prevent the electrons from reaching the surface of target 12 thereby creating an excessive current through the target 12. Wire mesh 13 confines the electric field produced by voltage $V_t$ on the target 10 to a narrow region above the target surface, where it is effective in accelerating sputtered ions before they are neutralized. Without this isolation, it is virtually impossible to produce a positive bias on the target 10 under these conditions due to the large electron current drawn from the plasma in beam 11 which in this case is an ion beam composed of positive argon ions. The source of ions is a standard Kaufman ion source of the variety discussed in a chapter entitled "Ion Beam Deposition" by J. M. E. Harper, in a book entitled, "Thin Film Processes," edited by J. L. Vossen and W. Kern published by Academic Press in 1978. See FIG. 4 in that chapter.

Although such sources are well known to those skilled in the art, a brief description follows for the convenience of the reader. A discharge chamber 27 is provided inside annular anode 19 within which argon gas is permitted to flow at about 3 standard cubic centimeters per minute (sccm) to provide a pressure of about $10^{-3}$ Torr or a factor of 10 higher than the pressure in the chamber 14. A tantalum cathode 20 extends into the chamber 27 to provide electrons. The anode is maintained at a small positive voltage with respect to the cathode such as 40 volts. Extraction grids 16 and 17 include the screen grid 17 held at a beam voltage between about several hundred volts to several thousand volts. A typical beam voltage is 1000 volts. The accelerator grid 16 is typically held at voltage $V_A$ of about minus 100 volts. A neutralizer wire 15 is composed of a metal such as tantalum. The target voltage can be held at a voltage ranging from zero to several hundred volts positive or negative. Deposition onto substrate 12 occurs up to negative voltages of about −500 V. Etching occurs at voltages more negative than about −500 V. Chamber 14 can be 18 inches in diameter, for example.

Figure 5:
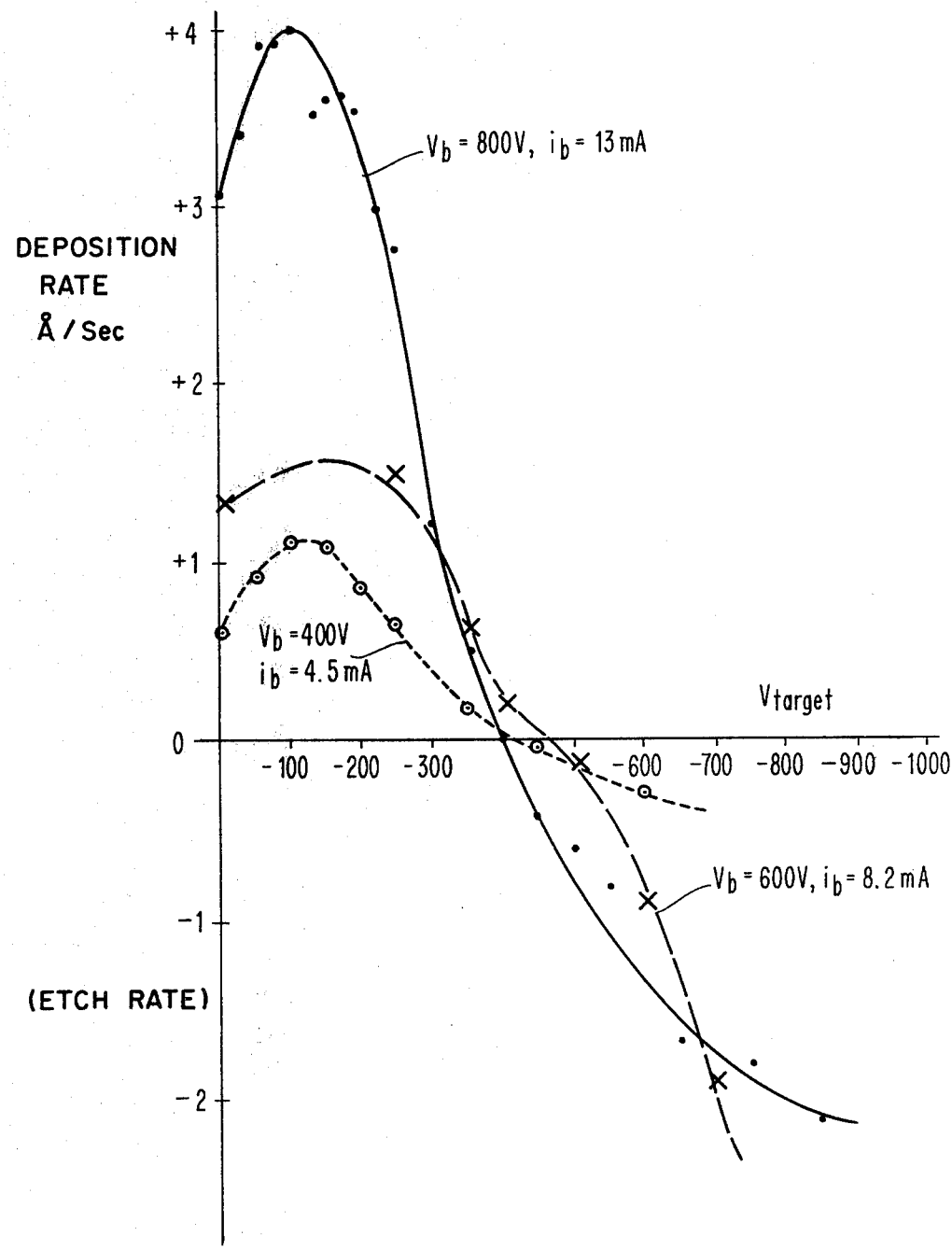
FIG. 5 shows the deposition and etching rates as measured in thickness as a function of time versus target voltage for an argon ion beam with a target of SmAu.
Figure 6:
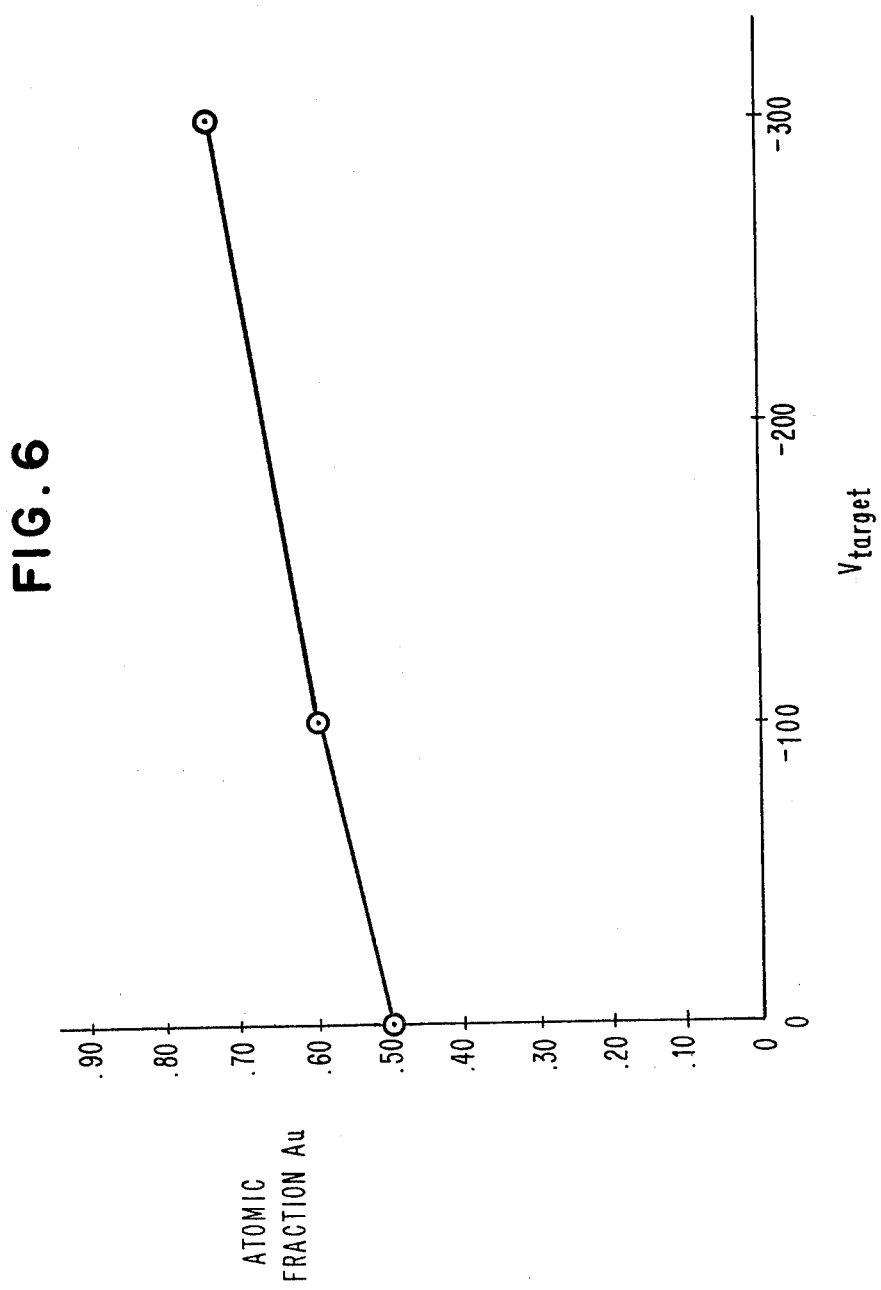
FIG. 6 shows the atomic fraction of Au received in the film produced as a function of target voltage for an SmAu target.

FIGS. 5 and 6 show the deposition and etching rates in Å/sec and the atomic fraction of Au in films respectively as a function of $V_t$ for films deposited in a system of that variety with an 800 eV argon positive ion beam. The target was biased at $V_t$ and the deposition rate is shown as a function of that voltage for varying values of beam voltage $V_b$ in FIG. 5 and with a rate monitor 5 cm from the target. The etch rate is seen to come into play between −400 and −500 volts for varying values of beam voltage $V_b$ obtained by varying the voltage on grid 17 of FIG. 4. Below $-400$ V$_t$, films enriched in Au are deposited; at the negative V$_t$ values "above" about $-400$ V no film is deposited and substrate 12 is etched.

Figure 7:
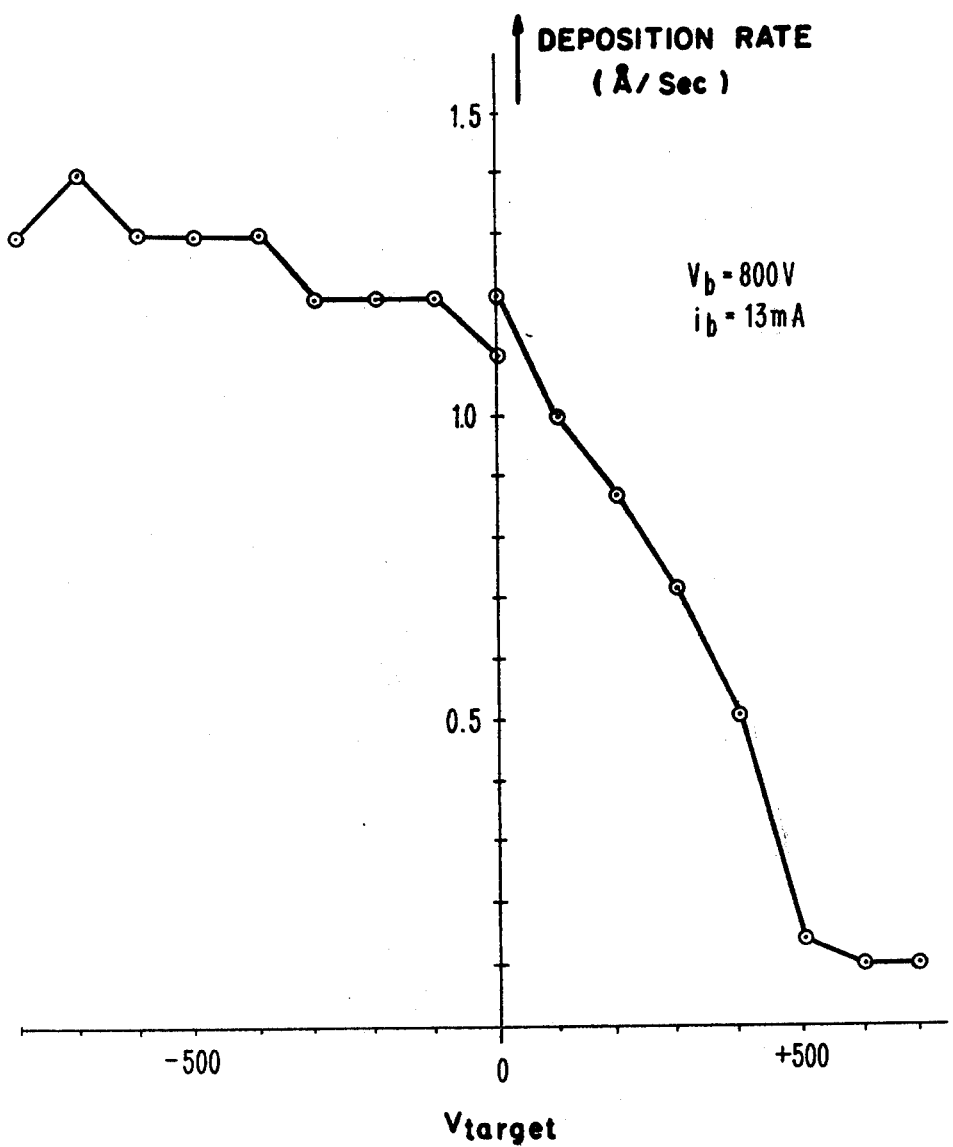
FIG. 7 shows the deposition rate of Cu received in thickness as a function of time versus target voltage when the target is bombarded with an argon ion beam.
Figure 8:
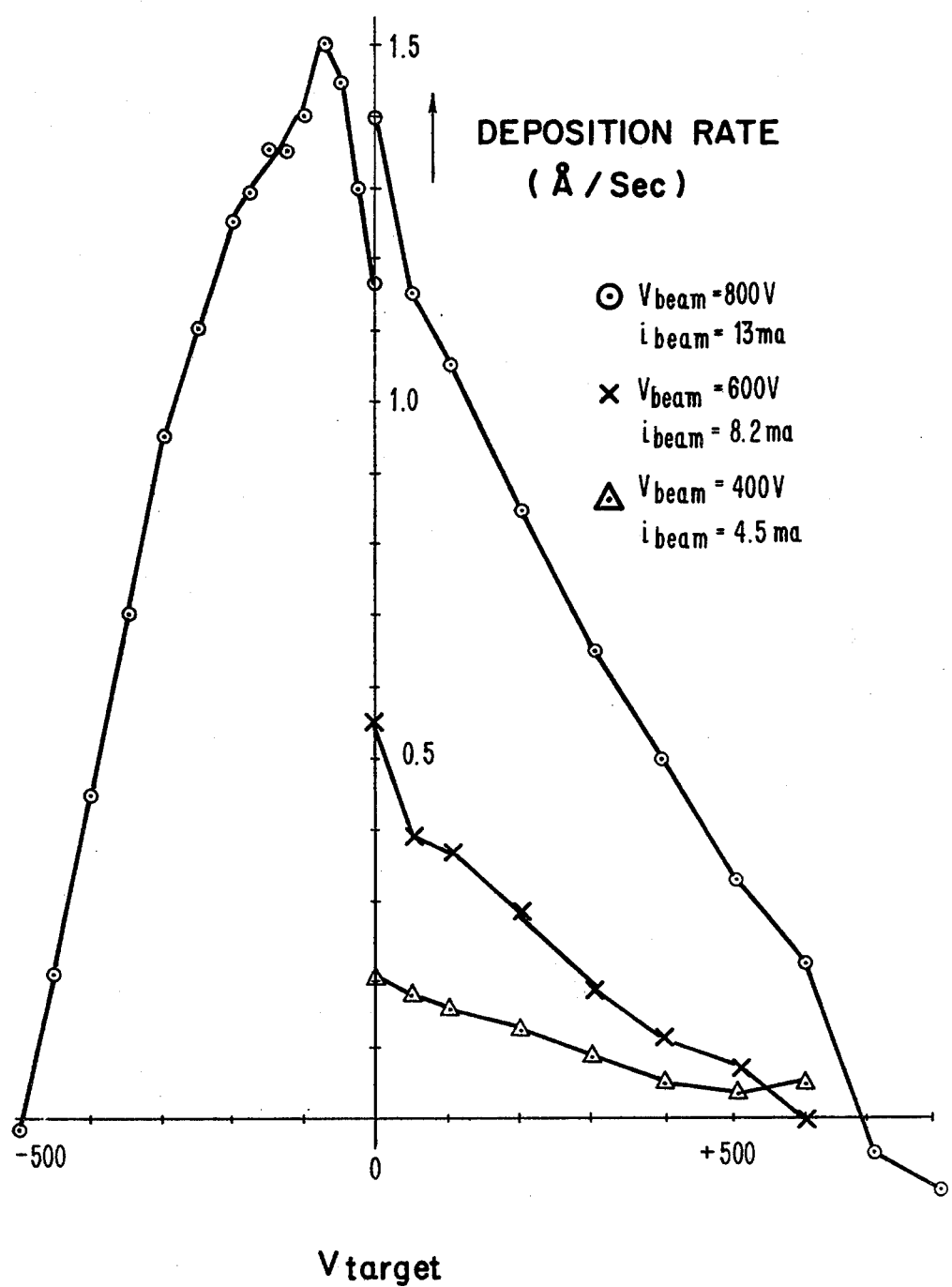
FIG. 8 shows a curve of deposition rate of SmAu as a function of target voltage for varying beam voltages. Large negative values of target voltage led to etching of the substrate.
Figure 9:
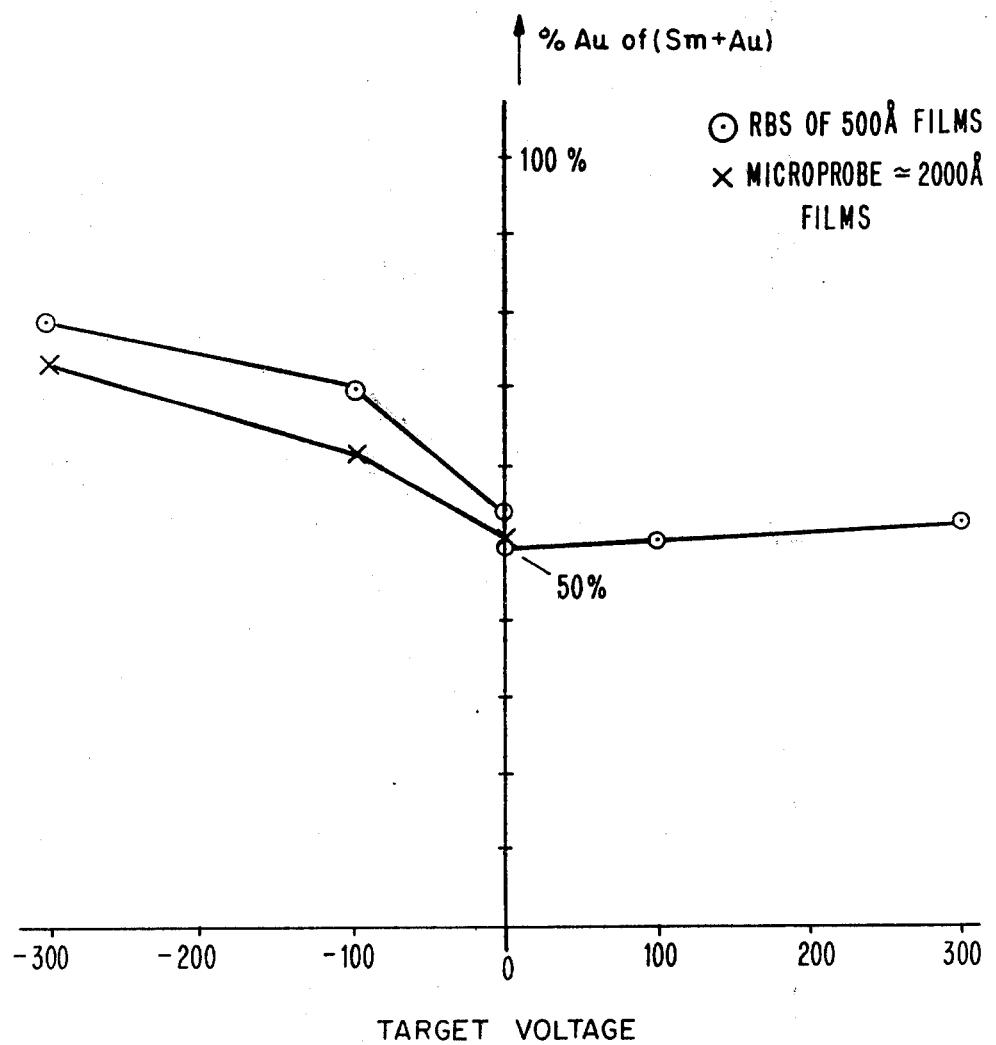
FIG. 9 shows the composition of the film produced in percentage of Au of Sm and Au.

FIG. 6 shows the atomic fraction of gold in the film as a function of target voltage V$_t$. The atomic fraction of Au in the film was increased by 22% for a target voltage of $-300$ volts. FIGS. 7, 8 and 9 were based upon a system in which the target was spaced from the substrate by 6 cm and the wire mesh was about 0.5 cm gauge in grid 13. The grid 13 was grounded as was the substrate 12.

FIG. 7 shows the deposition rate of Cu received from a Cu target being bombarded by 800 ev argon ions, with the target held at a potential of V$_t$. As V$_t$ increases negatively, the Cu deposition rate increases slightly due to the higher impact energy of the argon ions on the target (800 $-$V$_t$). For positive V$_t$, the Cu deposition rate decreases due to the decreased impact energy of the Ar ions. This is the behavior of a target which does not generate large numbers of negative or positive ions. This graphic information can be used as a basis for comparison to show what happens in the absence of such ions.

FIG. 8 shows the deposition rate of SmAu from a biased SmAu target. In this case, negative V$_t$ strongly depresses the deposition rate since in this case Au$^-$ ions are bombarding the growing film. At a high enough value of about $-500$ V, etching occurs. Also for small values of negative V$_t$, around $-100$ V, the curve shows an increase in deposition rate since this voltage is high enough to steer all the Au$^-$ ions towards the substrate but still at low enough energy not to resputter the growing film. The effect of positive V$_t$ values is similar to that obtained using the Cu target since there is apparently only a small yield of Sm$^+$ ions from this target.

FIG. 9 shows a composition analysis of deposited films by Rutherford Back Scattering (RBS) illustrating the dependence of deposited film composition on target voltage. For negative V$_t$, a strong increase in Au content of the film is found, whereas only a small effect is found for positive V$_t$. We would expect a stronger effect for positive V$_t$ with a more ionic target compound yielding a larger flux of positive ions.

Figure 10:
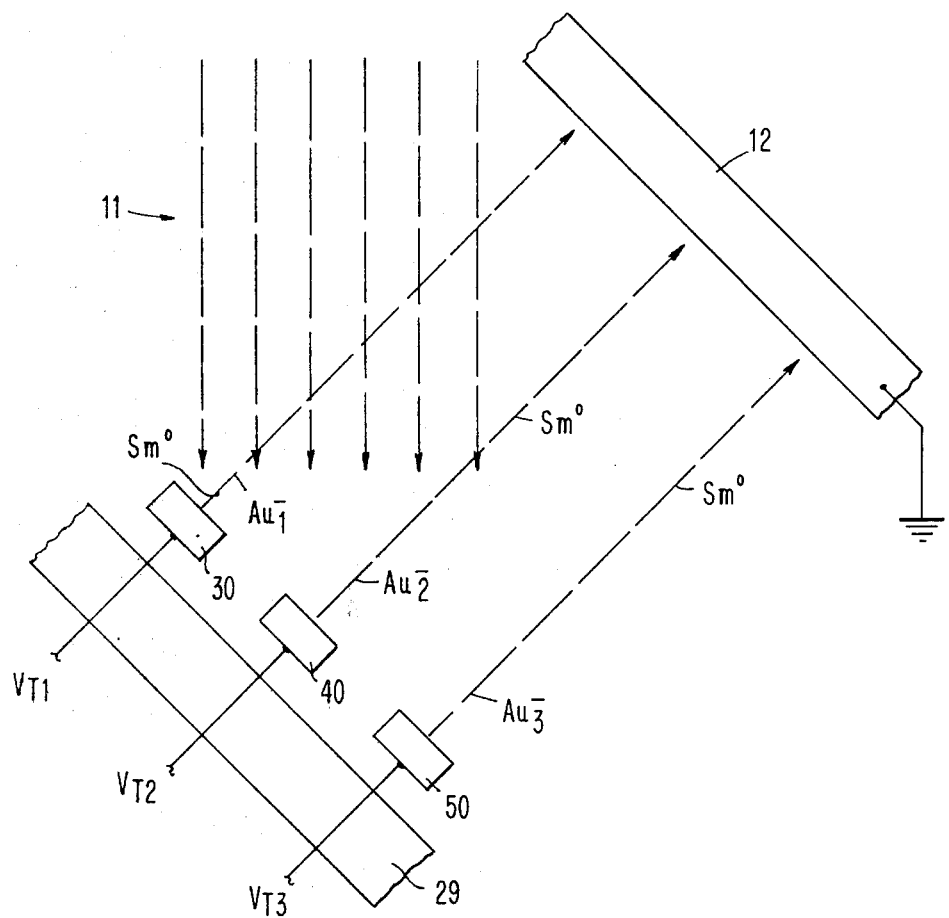
FIG. 10 shows a plurality of juxtaposed targets onto which a particle beam is directed. The targets lie opposite a substrate to be coated.

In FIG. 10 target segments 30, 40 and 50 on holder 29 can be biased at different voltages V$_{t1}$, V$_{t2}$, V$_{t3}$, thereby varying the acceleration of the different segments will produce a variation in composition across the surface. The emphasis in resputtering can be changed simply by varying the target polarity, i.e., dominant negative ions, then dominant positive ions bombardment of the surface.

FIG. 11 shows the values of Mulliken (m) electronegatively m of elements on the periodic chart in numerical values. Values in the equation m=(I+EA)/2 are derived as follows. I is derived from C. E. Moore's NBS Std. Ref. Data, 34 (1970). EA is drived from H. Hotop, W. C. Lineberger, Journal Phys. Chem. Data, 4, 53a (1975).

INDUSTRIAL APPLICABILITY

This invention is useful for producing products by sputtering ions in a vacuum system with a single evacuation cycle including deposition and etching steps using plural materials with a single target or plural targets.

Having thus described our invention, what we claim as new and desire to secure by Letters Patent is:

1. A method for use of an energetic particle beam directed at a target for selective ejection of ions of a plurality of elements from a target forming both positive and negative ions towards a substrate comprising the steps of:
    bombarding said target with an energetic particle beam, said target including a plurality of elements adapted for forming both positive and negative ions ejected therefrom; applying a potential difference between said target and said substrate for attracting ions ejected from said target by said energetic particle beam to said substrate;
    adjusting the potential difference between said target and said substrate to direct predetermined proportions of positive and negative ions to said substrate as a function of said potential difference with variations of said difference and said elements are deposited selectively upon said substrate as a function of said potential difference.

2. A method in accordance with claim 1 wherein said target is maintained at a negative potential with respect to said substrate.

3. A method in accordance with claim 1 wherein said beam comprises an ion beam.

4. A method in accordance with claim 1 wherein said target comprises a plurality of separate units each at a separately controlled voltage whereby selective application of potential thereto provides a multiplicity of simultaneously selectable combinations of coating and etching possibilities.

5. A method in accordance with claim 1 wherein said target comprises an intermetallic compound of SmAu.

6. A method in accordance with claim 1 or 2 wherein said target and said beam are maintained at a predetermined angle whereby the angle of reflection of particles in said beam is a first angle, and said substrate is juxtaposed opposite from said target at substantially a parallel alignment therewith, whereby reflected neutral particles bounce away from said substrate.

7. A method of use of an energetic particle beam directed at a target for selective ejection of ions of a plurality of elements from a target forming ions towards a substrate comprising the steps of:
    locating a target in the path of said energetic particle beam,
    placing a surface of a substrate opposite from said target,
    bombarding said target with an energetic particle beam for forming both positive and negative ions ejected therefrom,
    applying a potential difference between said target and said substrate for attracting ions ejected from said target by said energetic particle beam,
    adjusting the potential difference between said target and said substrate to direct predetermined proportions of positive and negative ions to said substrate as a function of said potential difference with variations of said difference and said elements are deposited selectively upon said substrate as a function of said potential difference,
    said target and said beam being maintained at a predetermined angle whereby the angle of reflection of particles in said beam is a first angle, and said substrate is juxtaposed opposite from said target at substantially a parallel alignment therewith, whereby reflected neutral particles bounce away from said substrate,
    said target including a plurality of separate units,
    said separate units being at a separately controlled voltage whereby selective application of potential thereto provides a multiplicity of simultaneously selectable combinations of coating with different elements.

8. A method in accordance with claim 7 wherein said target comprises an intermetallic compound of SmAu.

9. A method of use of an energetic particle beam directed at a target for selective ejection of ions of a plurality of elements from a target forming ions towards a substrate comprising the steps of:
   locating a target in the path of said energetic particle beam,
   placing a means for collecting electrons comprising a grid adjacent to said target,
   placing a surface of a substrate opposite from said target,
   bombarding said target with an energetic particle beam to form both positive and negative ions ejected therefrom,
   applying a potential difference between said target and said substrate for attracting ions ejected from said target by said energetic particle beam to said substrate,
   adjusting the potential difference between said target and said substrate to direct predetermined proportions of positive and negative ions to said substrate as a function of said potential difference with variations of said difference and said elements are deposited selectively upon said substrate as a function of said potential difference.

10. A method of use of an energetic particle beam directed at a target for selective ejection of ions of a plurality of elements from a target forming ions towards a substrate comprising the steps of:
    locating a target in the path of said energetic particle beam,
    placing a means for collecting electrons comprising a grid adjacent to said target,
    placing a surface of a substrate opposite from said target,
    bombarding said target with an energetic particle beam for forming both positive and negative ions ejected therefrom,
    applying a potential difference between said target and said substrate for attracting negative ions ejected from said target by said energetic particle beam to said substrate said target being maintained at a more negative potential than said grid and said substrate,
    adjusting the potential difference between said target and said substrate to direct predetermined proportions of positive and negative ions to said substrate as a function of said potential difference with variations of said difference and said elements are deposited selectively upon said substrate as a function of said potential difference.

11. A method in accordance with claim 1, 2, 3, 6, 9, 7, 8, or 10, wherein said target includes a plurality of elements with at least one element selected from the group consisting of Li, Na, K, Rb, Cs, Sr, In, Ba, La, Ce, Pr, Nd, Pm, Sm, Eu, Tb and Dy and one element selected from the group consisting of Au, Pt, Ir, Hg, Po, Os, Sb, Zn, C, S, N, O, F, Cl, Br, I, At, Se, and Te, forming negative and positive ions respectively in response to bombardment by said energetic particle beam.

12. A method of use of an energetic particle beam directed at a target for selective ejection of ions of a plurality of elements from a target forming ions towards a substrate comprising the steps of:
    locating a target in the path of said energetic particle beam,
    placing a means for collecting electrons comprising a grid adjacent to said target,
    placing a surface of a substrate opposite from said target,
    bombarding said target with an energetic particle beam for forming both positive and negative ions ejected therefrom,
    applying a potential difference between said target and said substrate primarily for attracting negative ions ejected from said target by said energetic particle beam for maintaining said target at a more negative potential than said grid and said substrate,
    adjusting the potential difference between said target and said substrate to direct predetermined proportions of positive and negative ions to said substrate as a function of said potential difference with variations of said difference and said elements are deposited selectively upon said substrate as a function of said potential difference,
    said target and said beam being maintained at a predetermined angle whereby the angle of reflection of particles in said beam is a first angle, and said substrate is juxtaposed opposite from said target at substantially a parallel alignment therewith, whereby reflected neutral particles bounce away from said substrate,
    said target including a plurality of separate elements with at least one element selected from the group consisting of Li, Na, K, Rb, Cs, Sr, In, Ba, La, Ce, Pr, Nd, Pm, Sm, Eu, Tb and Dy and one element selected from the group consisting of Au, Pt, Ir, Hg, Po, Os, Sb, Zn, C, S, N, O, F, Cl, Br, I, At, Se, and Te, forming negative and positive ions respectively in response to bombardment by said energetic particle beam,
    said separate elements being at a separately controlled voltage whereby selective application of potential thereto provides a multiplicity of simultaneously selectable combinations of coating with different elements.

13. A method in accordance with claim 12 wheren said target comprises an intermetallic compound of SmAu.

* * * * *